(12) United States Patent
Liu et al.

(10) Patent No.: US 8,213,085 B2
(45) Date of Patent: Jul. 3, 2012

(54) IMAGE SENSOR DEVICE WITH HIGH PHOTOSENSITIVITY

(75) Inventors: Wu-Chieh Liu, Keelung (TW); Chin-Poh Pang, Hsinchu (TW)

(73) Assignee: VisEra Technologies Company Limited, Hsinchu Science Park (TW)

( * ) Notice: Subject to any disclaimer, the term of this patent is extended or adjusted under 35 U.S.C. 154(b) by 810 days.

(21) Appl. No.: 12/010,071

(22) Filed: Jan. 18, 2008

(65) Prior Publication Data

US 2009/0185275 A1 Jul. 23, 2009

(51) Int. Cl.
*G02B 1/10* (2006.01)
*G02B 5/18* (2006.01)

(52) U.S. Cl. ......... 359/586; 359/576; 428/141; 428/156

(58) Field of Classification Search .................. 359/586, 359/576; 257/291; 313/478; 428/141, 156
See application file for complete search history.

(56) References Cited

U.S. PATENT DOCUMENTS

| | | | | |
|---|---|---|---|---|
| 6,677,703 | B2 * | 1/2004 | Ito et al. | 313/478 |
| 7,371,786 | B2 * | 5/2008 | Yoshihara et al. | 523/205 |
| 7,453,109 | B2 * | 11/2008 | Koizumi et al. | 257/291 |
| 2006/0130891 | A1 * | 6/2006 | Carlson | 136/256 |

* cited by examiner

*Primary Examiner* — Audrey Y Chang
(74) *Attorney, Agent, or Firm* — Muncy, Geissler, Olds & Lowe, PLLC

(57) ABSTRACT

An anti-reflection structure for transmitting a light source is disclosed. The anti-reflection structure comprises a first dielectric layer of a first refractive index and a second dielectric layer of a second refractive index different from the first refractive index. The first dielectric layer has a plurality of protrusions randomly arranged on a top surface thereof, in which the plurality of protrusions and the intervals therebetween has an average size smaller than the wavelength of the light source. The second dielectric layer has a bottom surface conformally attached to the top surface of the first dielectric layer. The invention also discloses an image sensor device having the anti-reflection structure.

12 Claims, 2 Drawing Sheets

IMAGE SENSOR DEVICE WITH HIGH PHOTOSENSITIVITY

BACKGROUND OF THE INVENTION

1. Field of the Invention

The invention relates to an optoelectronic device and more particularly to an image sensor device having a sub-wavelength anti-reflection structure.

2. Description of the Related Art

As optoelectronic applications, such as digital cameras, digital video recorders, image capture capable mobile phones and monitors, become more and more popular, the demand for image sensor devices accordingly increase. An image sensor device is used for recording a photo signal change from an image and converting the photo signal into an electronic signal. After recording and processing the electronic signal, a digital image is generated. In general, image sensor devices can be categorized into two main types, one is charge coupled devices (CCD) and the other complementary metal oxide semiconductor (CMOS) devices.

The image sensor typically includes the photosensitive parts, such as photosensors, sensing the lights and accumulating photocharges and control circuit parts transforming the photocharges into electric signals and generating data. In order to increase the photosensitivity of the image sensor device, there have been proceeded endeavors to increase the fill factor of the photosensitive parts in the unit pixel. However, since the control circuit parts cannot be completely eliminated, the photosensitive parts exist in a limited area. Moreover, if the unit pixel size increases to improve the photosensitivity, the resolution will be reduced due to reduction of the number of the pixels.

Therefore, there is a need to develop a novel structure of an image sensor device capable of increasing photosensitivity of the image sensor device.

BRIEF SUMMARY OF THE INVENTION

A detailed description is given in the following embodiments with reference to the accompanying drawings. An anti-reflection structure for transmitting a light source and an image sensor device are provided. An embodiment of an anti-reflection structure for transmitting a light source comprises a first dielectric layer of a first refractive index and a second dielectric layer of a second refractive index different from the first refractive index. The first dielectric layer has a plurality of protrusions randomly arranged on a top surface thereof, in which the plurality of protrusions and the intervals therebetween has an average size smaller than the wavelength of the light source. The second dielectric layer has a bottom surface conformally attached to the top surface of the first dielectric layer.

An embodiment of an image sensor device comprises a substrate having at least one photosensor therein for sensing a light source and an anti-reflection structure disposed on the substrate. The anti-reflection structure comprises a first dielectric layer of a first refractive index and a second dielectric layer of a second refractive index different from the first refractive index. The first dielectric layer has a plurality of protrusions randomly arranged on a top surface thereof, in which the plurality of protrusions and the intervals therebetween has an average size smaller than the wavelength of the light source. The second dielectric layer has a bottom surface conformally attached to the top surface of the first dielectric layer.

BRIEF DESCRIPTION OF DRAWINGS

The invention can be more fully understood by reading the subsequent detailed description and examples with references made to the accompanying drawings, wherein.

DETAILED DESCRIPTION OF INVENTION

The following description is of the best-contemplated mode of carrying out the invention. This description is provided for the purpose of illustrating the general principles of the invention and should not be taken in a limiting sense. The scope of the invention is best determined by reference to the appended claims.

Figure 1:
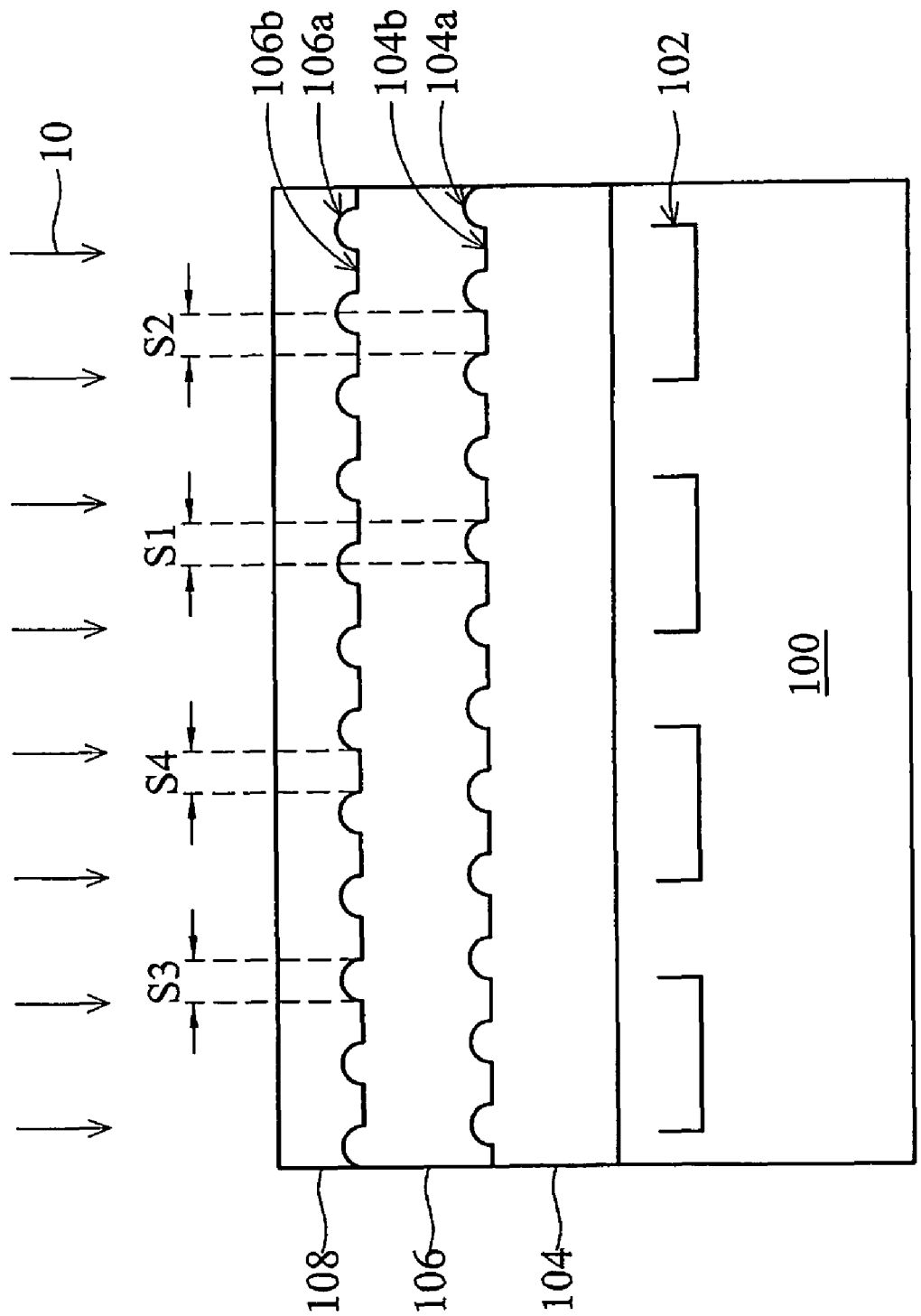
FIG. 1 is a cross section of an exemplary embodiment of an image sensor device according to the invention.

FIG. 1 illustrates an exemplary embodiment of an image sensor device according to the invention. The image sensor device comprises a substrate 100, such as a semiconductor substrate, having a plurality of photosensors 102 therein for sensing a light source 10 with a single, multiple or a broad range d wavelengths. The photosensors 102 may comprise photodiodes, phototransistors or other photosensors well known in the art. Isolation regions (not shown) may be formed in the substrate 100 to define active regions for arrangement of the plurality of photosensors 102. Each photosensor 102 corresponds to a control integrated circuit (not shown), such as a CMOS circuit for converting a photo signal from the light source 10 into an electronic signal.

An anti-reflection structure is disposed on the substrate 100. The anti-reflection structure may comprise a multi-layered structure. For example, the multi-layered structure comprises a first dielectric layer 104 of a first refractive index, a second dielectric layer 106 of a second refractive index different from the first refractive index, and a material layer 108 of a third refractive index different from the second refractive index successively disposed on the substrate 100. In the embodiment, the first refractive index may be greater than the second refractive index. For example, the first dielectric layer 104 may be composed of silicon nitride (e.g., SiN, $Si_3N_4$) which serves as a sealing layer or a diffusion barrier layer. Moreover, the second dielectric layer 106 may be composed of silicon oxide or low k material, such as fluorinated silicate glass (FSG), carbon doped oxide, methyl silsesquioxane (MSQ), hydrogen silsesquioxane (HSQ), or fluorine tetra-ethyl-orthosilicate (FTEOS), which serves as an interlayer dielectric (ILD) layer. The first and second dielectric layers 104 and 106 can be formed by, for example, chemical vapor deposition (CVD), low pressure chemical vapor deposition (LPCVD), plasma enhanced chemical vapor deposition (PECVD), high density plasma chemical vapor deposition (HDPCVD) or other deposition processes well known in the art. In another embodiment, the second refractive index may be greater than the first refractive index. For example, the second dielectric layer 106 may be composed of silicon nitride which serves as a passivation or planarization layer. Moreover, the first dielectric layer 104 may be composed of silicon oxide or low k material which serves as an interlayer dielectric (ILD) layer or an intermetal dielectric (IMD) layer.

In particular, the first dielectric layer 104 has a plurality of protrusions 104a randomly arranged on a top surface thereof. A bottom surface of the second dielectric layer 106 is conformally attached to the top surface of the first dielectric layer 104. In the embodiment, the protrusion 104a may have the same or different sizes S1 and have an average size smaller than the wavelength of the light source 10. Moreover, the intervals 104b between the protrusions 104a may also have the same or different sizes S2 and have an average size smaller than the wavelength of the light source 10. As a result, a subwavelength interface is formed between the first and second dielectric layers 104 and 106. As the light source 10 transmitted into the photosensors 102 through the subwavelength interface, the reflection at subwavelength interface can be reduced, thereby enhancing the transmission in the multi-layered structure. That is, the subwavelength interface provides an antireflection property. Moreover, the subwavelength interface with randomly arranged protrusion 104a can provide better antireflection for a light source with a broad range of wavelengths than that for a light source with a specific wavelength. In the embodiment, the randomly arranged protrusion 104a can be formed by performing ion bombardment on the top surface of the first dielectric layer 104. In another embodiment, the randomly arranged protrusion 104a can be formed by performing conventional lithography and etching on the top surface of the first dielectric layer 104.

Additionally, the second dielectric layer 106 may have a plurality of protrusions 106a randomly arranged on a top surface thereof as the material layer 108 of a third refractive index different from the second refractive index is formed thereon. That is, the material layer 108 has a bottom surface conformally attached to the top surface of the second dielectric layer 106. The protrusion 106a may have the same or different sizes S3 and have an average size smaller than the wavelength of the light source 10. Moreover, the intervals 106b between the protrusions 106a may also have the same or different sizes S4 and have an average size smaller than the wavelength of the light source 10. As a result, a subwavelength interface is formed between the second dielectric layer 106 and the material layer 108. The protrusion 106a may be formed by a similar method for formation of the protrusion 104a. The material layer 108 may comprise resin which is used for formation of a microlens array, a color filter, or combination thereof. In another embodiment, the material layer 108 may be composed of silicon oxide as the underlying second dielectric layer 106 is composed of silicon nitride. As the light source 10 is transmitted into the photosensors 102 through the subwavelength interface between the material layer 108 and the second dielectric layer 108, the transmission in the multi-layered structure can be enhanced.

Figure 2:
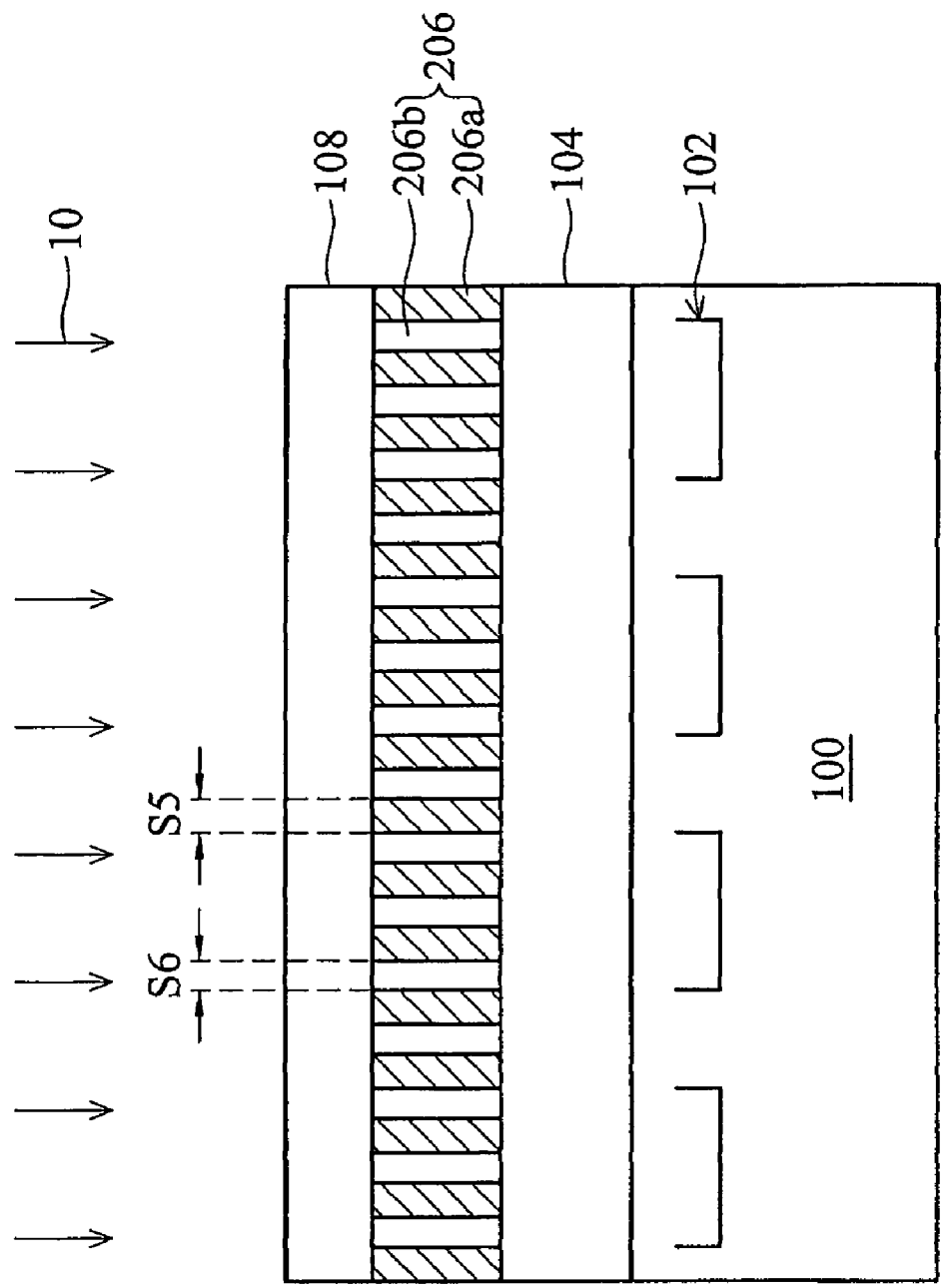
FIG. 2 is a cross section of another exemplary embodiment of an image sensor device according to the invention.

FIG. 2 illustrates another exemplary embodiment of an image sensor device according to the invention, in which the elements in FIG. 2 that are the same as those in FIG. 1 are labeled with the same reference numbers as in FIG. 1 and are not described again for brevity. In this embodiment, the refractive index of the dielectric layer 104 is similar to that of the material layer 108 and a dielectric layer 206 with a subwavelength grating structure is interposed therebetween instead of the dielectric layer 106 with a plurality of subwavelength protrusions 106a as shown in FIG. 1. The dielectric layer 206 is composed of a plurality of first grating portions 206a and a plurality of second grating portions 206b alternately arranged. In the embodiment, the plurality of first grating portions 206a is composed a material which is the same as the dielectric layer 106 as shown in FIG. 1 and the plurality of second grating portions 206b is composed of a material which is the same as the underlying dielectric layer 104 or the overlying material layer 108. Moreover, the first grating portions 206a may have the same or different sizes S5 and have an average size smaller than the wavelength of the light source 10. The second grating portions 206b may also have the same or different sizes S6 and have an average size smaller than the wavelength of the light source 10. As a result, subwavelength interfaces are formed between the dielectric layers 104 and 206 and between the dielectric layer 206 and the material layer 108. Accordingly, as the light source 10 is transmitted into the photosensors 102 through the subwavelength interfaces, the reflection at the subwavelength interfaces can be reduced, thereby enhancing the transmission in the multi-layered structure.

According to the embodiments, since the transmission in the multi-layered structure can be increased by forming subwavelength structure at the interface between two adjacent layers with different refractive indexes, more photocharges can be accumulated as the pixel size or fill factor is not increased. That is, photosensitivity of the image sensor device can be increased without increasing the pixel size or fill factor while the resolution of the image sensor device can be maintained.

While the invention has been described by way of example and in terms of preferred embodiment, it is to be understood that the invention is not limited thereto. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. An image sensor device, comprising:
   a substrate having at least one photosensor therein for sensing a light source; and
   an anti-reflection structure disposed on the substrate, comprising:
   a first dielectric layer of a first refractive index, having a plurality of protrusions randomly arranged on a top surface thereof, wherein the plurality of protrusions and the intervals therebetween have an average size smaller than the wavelength of the light source; and
   a second dielectric layer of a second refractive index different from the first refractive index, having a bottom surface conformally attached to the top surface of the first dielectric layer and a plurality of protrusions randomly arranged on a top surface thereof, wherein the plurality of protrusions of the second dielectric layer and the intervals therebetween have an average size smaller than the wavelength of the light source;
   wherein the plurality of protrusions of the second dielectric layer is not aligned with that of the first dielectric layer.

2. The image sensor device as claimed in claim 1, wherein the first refractive index is greater than the second refractive index.

3. The image sensor device as claimed in claim 2, wherein the first dielectric layer is composed of silicon nitride and the second dielectric layer is composed of silicon oxide.

4. The image sensor device as claimed in claim 1, wherein the second refractive index is greater than the first refractive index.

5. The image sensor device as claimed in claim 4, wherein the second dielectric layer is composed of silicon nitride and the first dielectric layer is composed of silicon oxide.

6. The image sensor device as claimed in claim 1, further comprising a material layer of a third refractive index different from the second refractive index, having a bottom surface conformally attached to the top surface of the second dielectric layer.

7. An anti-reflection structure for transmitting a light source, comprising:
   a first dielectric layer of a first refractive index, having a plurality of protrusions randomly arranged on a top surface thereof, wherein the plurality of protrusions and the intervals therebetween have an average size smaller than the wavelength of the light source; and a second dielectric layer of a second refractive index different from the first refractive index, having a bottom surface conformally attached to the top surface of the first dielectric layer and a plurality of protrusions randomly arranged on a top surface thereof, wherein the plurality of protrusions of the second dielectric layer and the intervals therebetween have an average size smaller than the wavelength of the light source;

wherein the plurality of protrusions of the second dielectric layer is not aligned with that of the first dielectric layer.

8. The anti-reflection structure as claimed in claim 7, wherein the first refractive index is greater than the second refractive index.

9. The image sensor device as claimed in claim 8, wherein the first dielectric layer is composed of silicon nitride and the second dielectric layer is composed of silicon oxide.

10. The anti-reflection structure as claimed in claim 7, wherein the second refractive index is greater than the first refractive index.

11. The anti-reflection structure as claimed in claim 10, wherein the second dielectric layer is composed of silicon nitride and the first dielectric layer is composed of silicon oxide.

12. The anti-reflection structure as claimed in claim 7, further comprising a material layer of a third refractive index different from the second refractive index, having a bottom surface conformally attached to the top surface of the second dielectric layer.

* * * * *